(12) United States Patent
Li et al.

(10) Patent No.: US 12,356,719 B2
(45) Date of Patent: Jul. 8, 2025

(54) SEMICONDUCTOR DEVICE REDUCING CHANNEL LENGTH AND ELECTRONIC DEVICE WITH THE SAME

(71) Applicant: Wuhan China Star Optoelectronics Technology Co., Ltd., Hubei (CN)

(72) Inventors: Zhifu Li, Hubei (CN); Guanghui Liu, Hubei (CN); Fei Ai, Hubei (CN); Dewei Song, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/802,166

(22) PCT Filed: Aug. 8, 2022

(86) PCT No.: PCT/CN2022/110813
§ 371 (c)(1),
(2) Date: Aug. 25, 2022

(87) PCT Pub. No.: WO2024/021151
PCT Pub. Date: Feb. 1, 2024

(65) Prior Publication Data
US 2024/0194684 A1    Jun. 13, 2024

(51) Int. Cl.
*H10D 86/60* (2025.01)
*H10D 30/67* (2025.01)
*H10D 86/40* (2025.01)

(52) U.S. Cl.
CPC ......... *H10D 86/60* (2025.01); *H10D 30/6723* (2025.01); *H10D 30/6757* (2025.01); *H10D 86/421* (2025.01)

(58) Field of Classification Search
CPC .......... H01L 27/1222; H01L 29/78633; H01L 29/78696; H01L 257/59
USPC ......................................................... 257/59
See application file for complete search history.

(56) References Cited

U.S. PATENT DOCUMENTS 6,566,172 B1 * 5/2003 Jackson ............ H01L 29/66765
257/E21.414
9,196,636 B2   11/2015 Zhang
(Continued)

FOREIGN PATENT DOCUMENTS

CN    100415063    *  8/2008
CN    103872139       6/2014
(Continued)

OTHER PUBLICATIONS

International Search Report and the Written Opinion Dated Dec. 16, 2022 From the International Searching Authority Re. Application No. PCT/CN2022/110813 and Its Translation Into English. (15 Pages).
(Continued)

*Primary Examiner* — Sheng-Bai Zhu

(57) ABSTRACT

A semiconductor device and an electronic device are provided. The semiconductor device includes an insulating substrate and a thin film transistor layer. The thin film transistor layer includes a first active layer and a first insulating layer disposed on the first active layer, and a convex portion is formed on the first insulating layer. The thin film transistor layer further includes a second active layer and a third active layer disposed on both sidewalls and an upper surface of the convex portion, one end of the first active layer is connected to the second active layer, and another end of the first active layer is connected to the third active layer.

17 Claims, 9 Drawing Sheets

A-A'

(56) References Cited

U.S. PATENT DOCUMENTS

| | | | |
|---|---|---|---|
| 10,325,938 B2 | 6/2019 | Liu | |
| 11,450,773 B2 | 9/2022 | Zhang et al. | |
| 2004/0197967 A1* | 10/2004 | Chen | H01L 27/1255 |
| | | | 257/E27.111 |
| 2008/0203477 A1 | 8/2008 | Yamazaki | |
| 2009/0020759 A1* | 1/2009 | Yamazaki | H10D 30/6743 |
| | | | 257/59 |
| 2018/0315781 A1 | 11/2018 | He et al. | |
| 2019/0165004 A1 | 5/2019 | Lou et al. | |
| 2024/0222445 A1* | 7/2024 | Huang | H01L 29/66742 |

FOREIGN PATENT DOCUMENTS

| | | | |
|---|---|---|---|
| CN | 105633101 | * | 6/2016 |
| CN | 106024637 | | 10/2016 |
| CN | 106910778 | | 6/2017 |
| CN | 107154407 | | 9/2017 |
| CN | 107425075 | * | 12/2017 |
| CN | 109686794 | | 4/2019 |
| CN | 111223878 | * | 6/2020 |
| CN | 111971794 | | 11/2020 |
| CN | 215644507 | | 1/2022 |
| CN | 114023768 | * | 2/2022 |
| WO | WO 2020140357 | * | 7/2020 |

OTHER PUBLICATIONS

Notification of Office Action and Search Report Dated Apr. 1, 2025 From The State Intellectual Property Office of the People's Republic of China Re. Application No. 202210893971.8 and Its Translation Into English. (22 Pages).

\* cited by examiner

SEMICONDUCTOR DEVICE REDUCING CHANNEL LENGTH AND ELECTRONIC DEVICE WITH THE SAME

RELATED APPLICATIONS

This application is a National Phase of PCT Patent Application No. PCT/CN2022/110813 having International filing date of Aug. 8, 2022, which claims the benefit of priority of Chinese Patent Application No. 202210893971.8 filed on Jul. 27, 2022. The contents of the above applications are all incorporated by reference as if fully set forth herein in their entirety.

FIELD AND BACKGROUND OF THE INVENTION

The present application relates to a field of display technology, and particularly relates to a semiconductor device and an electronic device.

Currently, flat display devices such as liquid crystal display devices (LCD) and organic light emitting diode (OLED) mobile terminals have advantages of high image quality, power saving, lightness and thinness, and a wide range of applications. They are widely used in various electronic products such as mobile phones, televisions, personal digital assistants, digital cameras, notebook computers, and desktop computers, and have become the mainstream of display devices.

It is known in the prior art that integrating IC circuits (integrated circuits) such as pixel circuits, driving circuits, multiplexing circuits, control circuits, logic circuits, etc. on a glass substrate (system on glass, SOG) can improve the integration of semiconductor devices and reduce the dependence on IC chips. In order to realize the SOG solution, it is necessary to improve the integration, maximum operating frequency, and current density of current thin-film transistors (TFTs). The electrical performance of the thin film transistor when it is turned on is related to the part of the active layer corresponding to the part between the source and the drain (i.e., the channel length of the active layer). In order to achieve the above effects, it is necessary to make the thin film transistor have a shorter channel length and a smaller volume. However, in the manufacturing process of conventional thin film transistors, when forming the "I" type active layer on the substrate by the current exposure equipment, the minimum size of the pattern of the mask used is generally greater than 2 km. Therefore, in the prior art, it is difficult to realize short channelization of the thin film transistor.

Embodiments of the present application provide a semiconductor device and an electronic device to alleviate the deficiencies in the related art.

SUMMARY OF THE INVENTION

In order to realize the above functions, the technical solutions provided by the embodiments of the present application are as follows:

Embodiments of the present application provide a semiconductor device, including: an insulating substrate; and a thin film transistor layer disposed on the insulating substrate, wherein the thin film transistor layer includes a first active layer disposed on the insulating substrate and a first insulating layer disposed on the first active layer, and a convex portion is formed on the first insulating layer; wherein the thin film transistor layer further includes a second active layer and a third active layer disposed on two sidewalls and an upper surface of the convex portion, one end of the first active layer is connected to the second active layer, and another end of the first active layer is connected to the third active layer.

In the semiconductor device provided by the embodiments of the present application, the second active layer includes a first conductor portion positioned on the upper surface of the convex portion, the third active layer includes a second conductor portion positioned on the upper surface of the convex portion, and the first conductor portion is spaced apart from the second conductor portion.

In the semiconductor device provided by the embodiments of the present application, in a direction perpendicular to the insulating substrate, an orthographic projection of the first conductor portion is positioned within an orthographic projection of the first active layer, an orthographic projection of the second conductor portion is positioned within an orthographic projection of the first active layer, and the orthographic projection of the first conductor portion does not overlap with the orthographic projection of the second conductor portion.

In the semiconductor device provided by the embodiments of the present application, the thin film transistor layer includes a first metal layer positioned on the upper surface of the convex portion, and the first metal layer includes a source connected to the first conductor portion and a drain connected to the second conductor portion.

In the semiconductor device provided in the embodiment of the present application, the source includes a first sub-portion and a second sub-portion, an orthographic projection of the first sub-portion on the insulating substrate overlaps with an orthographic projection of the first conductor portion on the insulating substrate, and an orthographic projection of the second sub-portion on the insulating substrate does not overlap with the orthographic projection of the first conductor portion on the insulating substrate; and wherein the drain includes a third sub-portion and a fourth sub-portion, an orthographic projection of the third sub-portion on the insulating substrate overlaps with an orthographic projection of the second conductor portion on the insulating substrate, and an orthographic projection of the fourth sub-portion on the insulating substrate does not overlap with the orthographic projection of the second conductor portion on the insulating substrate.

In the semiconductor device provided by the embodiments of the present application, the semiconductor device includes an electrode layer positioned on a side of the thin film transistor layer away from the insulating substrate, and the electrode layer is connected to the second sub-portion or the fourth sub-portion.

In the semiconductor device provided by the embodiments of the present application, the source is positioned between the first conductor portion and the convex portion, and the drain is positioned between the second conductor portion and the convex portion.

In the semiconductor device provided by the embodiments of the present application, the thin film transistor layer includes a channel positioned between the first active layer and the first conductor portion, and a relationship between a length of the channel and a height of the convex portion meets following formula:

$$L \equiv \frac{H}{\operatorname{Sin}(\alpha)}; \quad (1)$$

wherein L represents the length of the channel, H represents the height of the convex portion, and a represents an angle between one of the sidewalls and a lower surface of the convex portion.

In the semiconductor device provided by the embodiments of the present application, the angle α between the sidewall and the lower surface of the convex portion is greater than or equal to 45 degrees and less than 90 degrees.

In the semiconductor device provided by the embodiments of the present application, in a direction perpendicular to the insulating substrate, the length of the channel is greater than or equal to 100 angstroms and less than or equal to 10000 angstroms, and a width of the channel is greater than or equal to 300 angstroms and less than or equal to 100000 angstroms.

In the semiconductor device provided by the embodiments of the present application, the thin film transistor layer includes a second metal layer positioned on a side of the first insulating layer away from the insulating substrate, and wherein in a direction perpendicular to the insulating substrate, the second metal layer covers the first active layer, the second active layer, and the third active layer.

In the semiconductor device provided by the embodiments of the present application, the thin film transistor layer includes a second insulating layer positioned between the second metal layer and the first insulating layer, wherein in a direction perpendicular to the insulating substrate, the second insulating layer covers the first active layer, the second active layer, and the third active layer; and wherein on the upper surface of the convex portion, the second insulating layer is defined with a groove positioned between the second active layer and the third active layer, and the second metal layer fills the groove.

In the semiconductor device provided by the embodiments of the present application, the thin film transistor layer includes a plurality of thin film transistors, the first insulating layer includes a plurality of convex portions, and one of the plurality of thin film transistors is arranged corresponding to one of the plurality of convex portions, or the plurality of the thin film transistors are arranged corresponding to one of the plurality of convex portions.

In the semiconductor device provided by the embodiments of the present application, a cross-section of one of the sidewalls of the convex portion in a direction perpendicular to the insulating substrate includes a straight line or an arc.

In the semiconductor device provided by the embodiments of the present application, the semiconductor device includes a light shielding layer positioned between the insulating substrate and the first active layer, wherein the second active layer includes a first active segment positioned on one of the sidewalls, the third active layer includes a second active segment positioned on another one of the sidewalls, and wherein an orthographic projection of the light shielding layer on the insulating substrate covers an orthographic projection of the first active segment on the insulating substrate, and the orthographic projection of the light shielding layer on the insulating substrate covers an orthographic projection of the second active segment on the substrate.

An embodiment of the present application provides an electronic device. The electronic device includes a semiconductor device, and the semiconductor device includes: an insulating substrate; and a thin film transistor layer disposed on the insulating substrate, wherein the thin film transistor layer comprises a first active layer disposed on the insulating substrate and a first insulating layer disposed on the first active layer, and a convex portion is formed on the first insulating layer; and wherein the thin film transistor layer further comprises a second active layer and a third active layer disposed on two sidewalls and an upper surface of the convex portion, one end of the first active layer is connected to the second active layer, and another end of the first active layer is connected to the third active layer.

In the electronic device provided by the embodiment of the present application, the second active layer comprises a first conductor portion positioned on the upper surface of the convex portion, the third active layer comprises a second conductor portion positioned on the upper surface of the convex portion, and the first conductor portion is spaced apart from the second conductor portion.

In the electronic device provided by the embodiment of the present application, the thin film transistor layer includes a second metal layer positioned on a side of the first insulating layer away from the insulating substrate, and wherein in a direction perpendicular to the insulating substrate, the second metal layer covers the first active layer, the second active layer, and the third active layer.

In the electronic device provided by the embodiment of the present application, the thin film transistor layer includes a plurality of thin film transistors, the first insulating layer includes a plurality of convex portions, and one of the plurality of thin film transistors is arranged corresponding to one of the plurality of convex portions, or the plurality of the thin film transistors are arranged corresponding to one of the plurality of convex portions.

In the electronic device provided by the embodiment of the present application, a cross-section of one of the sidewalls of the convex portion in a direction perpendicular to the insulating substrate comprises a straight line or an arc.

Embodiments of the present application provide a semiconductor device and an electronic device. The semiconductor device includes an insulating substrate and a thin film transistor layer disposed on the insulating substrate. The thin film transistor layer includes a first active layer disposed on the insulating substrate and a first insulating layer disposed on the first active layer, and a convex portion is formed on the first insulating layer. The thin film transistor layer further includes a second active layer and a third active layer disposed on both sidewalls and an upper surface of the convex portion, one end of the first active layer is connected to the second active layer, and another end of the first active layer is connected to the third active layer. Therefore, the channel length is reduced, the short channel effect is reduced, the on-state current is increased, and the power consumption is reduced. Furthermore, the area of the thin film transistor is reduced, and the integration degree of the electronic device is improved.

BRIEF DESCRIPTION OF THE SEVERAL VIEWS OF THE DRAWINGS

The specific embodiments of the present application will be described in detail below with reference to the accompanying drawings, which will make it easier to understand the technical solutions and other beneficial effects of the present application.

DESCRIPTION OF SPECIFIC EMBODIMENTS OF THE INVENTION

Embodiments of the present application provide a semiconductor device and an electronic device. In order to make the objectives, technical solutions, and effects of the present application clearer, the present application will be further described in detail below with reference to the accompanying drawings and embodiments. The specific embodiments described herein are only used to explain the present application, but not to limit the present application.

Please refer to FIG. 4 to FIG. 9L, the embodiments of the present application provide a semiconductor device and an electronic device, and the semiconductor device includes: an insulating substrate; and a thin film transistor layer disposed on the insulating substrate, wherein the thin film transistor layer includes a first active layer disposed on the insulating substrate and a first insulating layer disposed on the first active layer, and a convex portion is formed on the first insulating layer; wherein the thin film transistor layer further includes a second active layer and a third active layer disposed on two sidewalls and an upper surface of the convex portion, one end of the first active layer is connected to the second active layer, and another end of the first active layer is connected to the third active layer.

Figure 1:
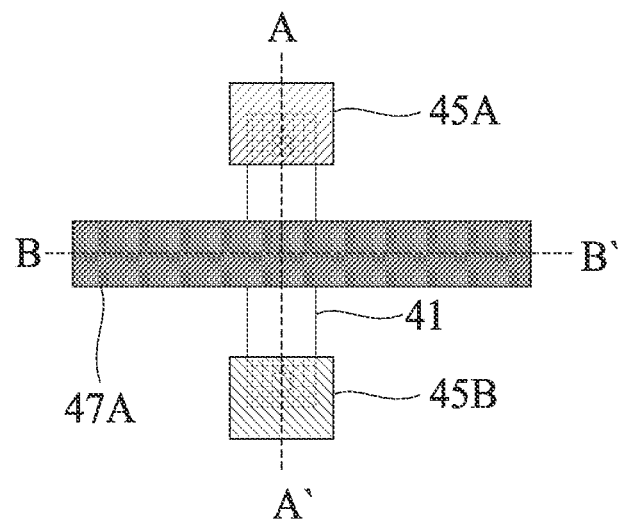
FIG. 1 is a top sectional view of a conventional display panel.
Figure 2:
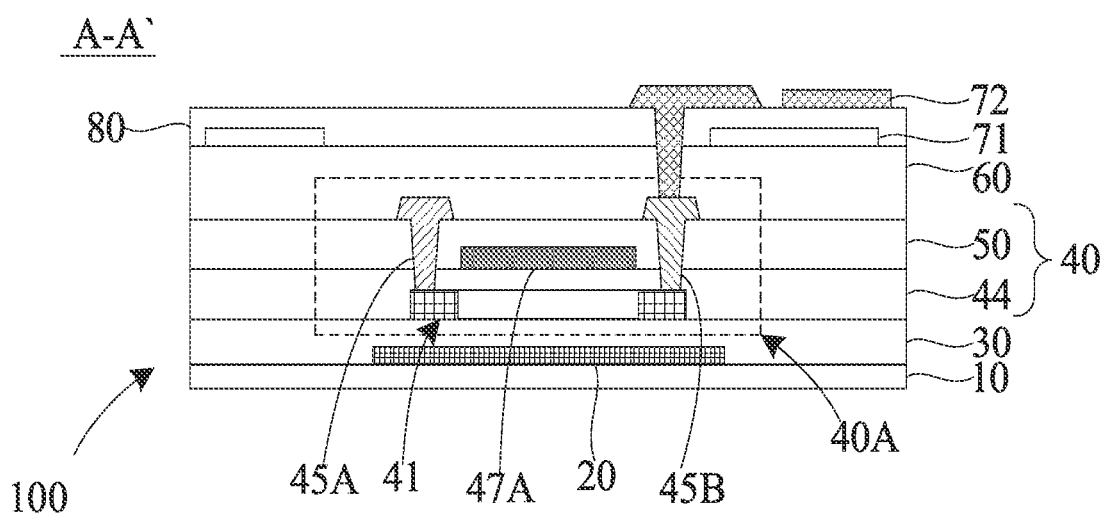
FIG. 2 is a schematic cross-sectional view along a A-A' direction in FIG. 1.
Figure 3:
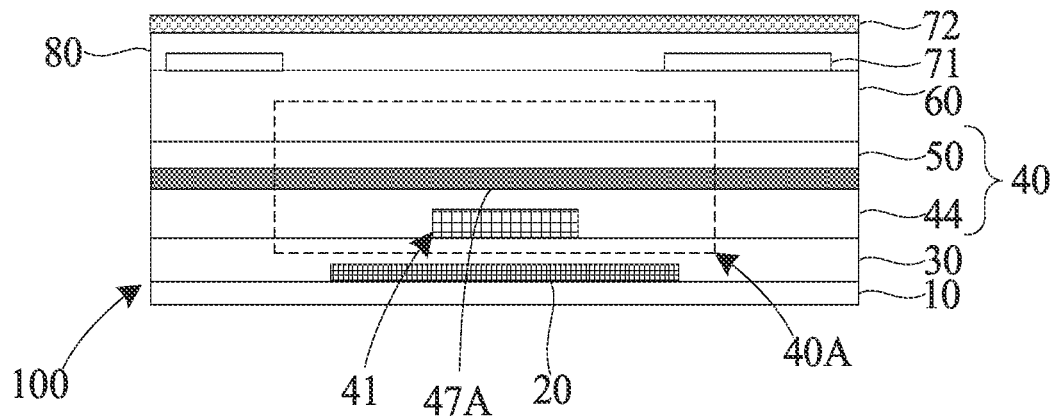
FIG. 3 is a schematic cross-sectional view along a B-B' direction in FIG. 1.

Please refer to FIG. 1 to FIG. 3. FIG. 1 is a top cross-sectional view of a conventional display panel. FIG. 2 is a schematic cross-sectional view along a A-A' direction in FIG. 1. FIG. 3 is a schematic cross-sectional view along a B-B' direction in FIG. 1. It should be noted that this embodiment does not specifically limit the structure of the display panel. The following description only takes an example that the display panel is a liquid crystal display (LCD) panel.

The display panel includes a first substrate 100, a second substrate (not shown) which are opposite to each other, and a liquid crystal layer disposed between the first substrate 100 and the second substrate. The first substrate 100 includes an insulating substrate 10, a light shielding layer 20, a buffer layer 30, a thin film transistor layer 40, a planarization layer 60, a common electrode 71, a passivation layer 80, and a pixel electrode 72 arranged in a stack. The thin film transistor layer 40 includes an active layer 41, a first insulating layer 44, a gate electrode 47A, an interlayer insulating layer 50, a source 45A, and a drain 45B that are sequentially stacked on the insulating substrate 10. The thin film transistor layer 40 includes a plurality of thin film transistors 40A arranged in a matrix, and one of the thin film transistors 40A is correspondingly positioned in one sub-pixel area.

Currently, it is known that integrating IC circuits (integrated circuits) such as pixel circuits, driving circuits, multiplexing circuits, control circuits, logic circuits, etc., on a glass substrate (system on glass, SOG) can improve the integration of display panel and reduce the dependence on IC chips. In order to realize the SOG solution, it is necessary to improve the integration, maximum operating frequency, and current density of current thin-film transistors (TFTs). The electrical performance of the thin film transistor when it is turned on is related to the portion of the active layer corresponding to a portion between the source and the drain (i.e., the channel length of the active layer). In order to achieve the above effects, it is necessary to make the thin film transistor to have a shorter channel length and a smaller volume. However, in the manufacturing process of the conventional thin film transistors, when forming the "I" type active layer on the substrate by current exposure equipment, the minimum size of pattern of the photo mask used in the process is generally greater than 2 m. Therefore, in the prior art, it is difficult to realize the short channelization of the thin film transistor 40A.

It can be understood that, by arranging the thin film transistor layer in the embodiment of the present application, the thin film transistor layer further includes a second active layer and a third active layer disposed on both sidewalls and an upper surface of the convex portion, one end of the first active layer is connected to the second active layer, and the other end of the first active layer is connected to the third active layer. Therefore, the channel length is reduced, the short channel effect is reduced, the on-state current is increased, and the power consumption is reduced. Furthermore, the area of the thin film transistor is further reduced, and the integration degree of the electrode device is improved.

The technical solutions of the present application will now be described with reference to specific embodiments.

Figure 4:
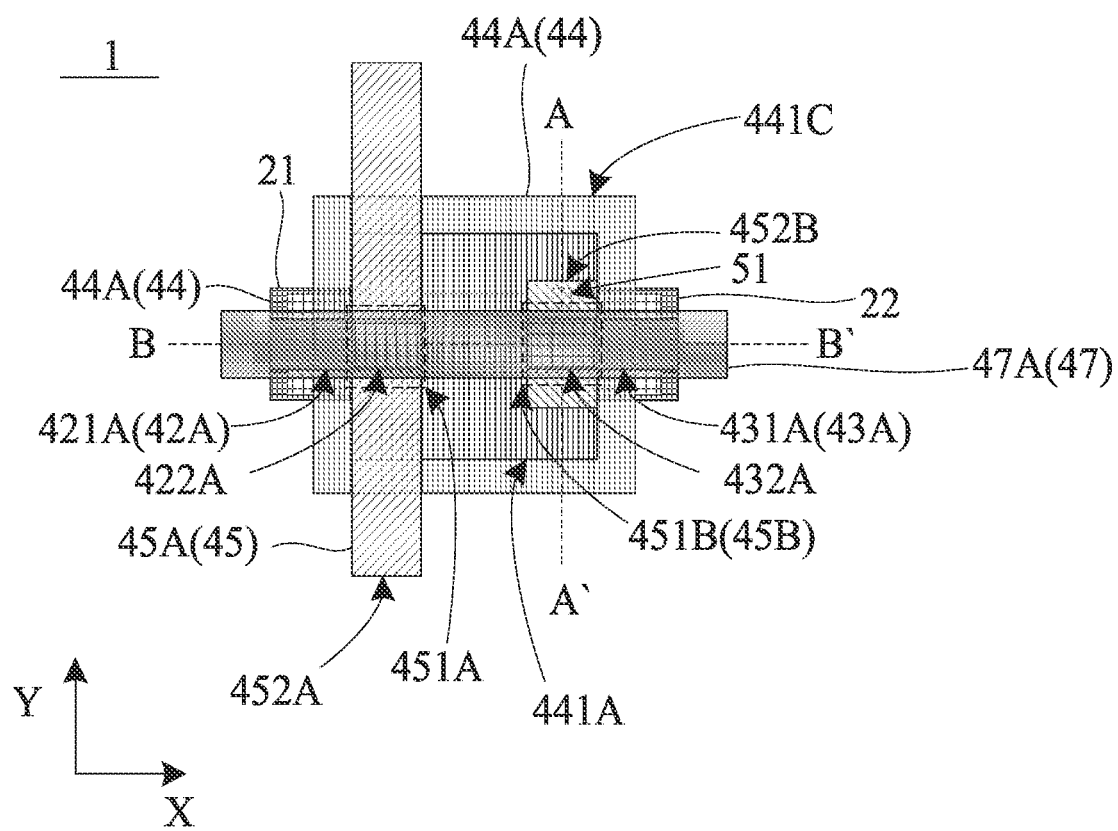
FIG. 4 is a top cross-sectional view of a semiconductor device provided by an embodiment of the present application.
Figure 5:
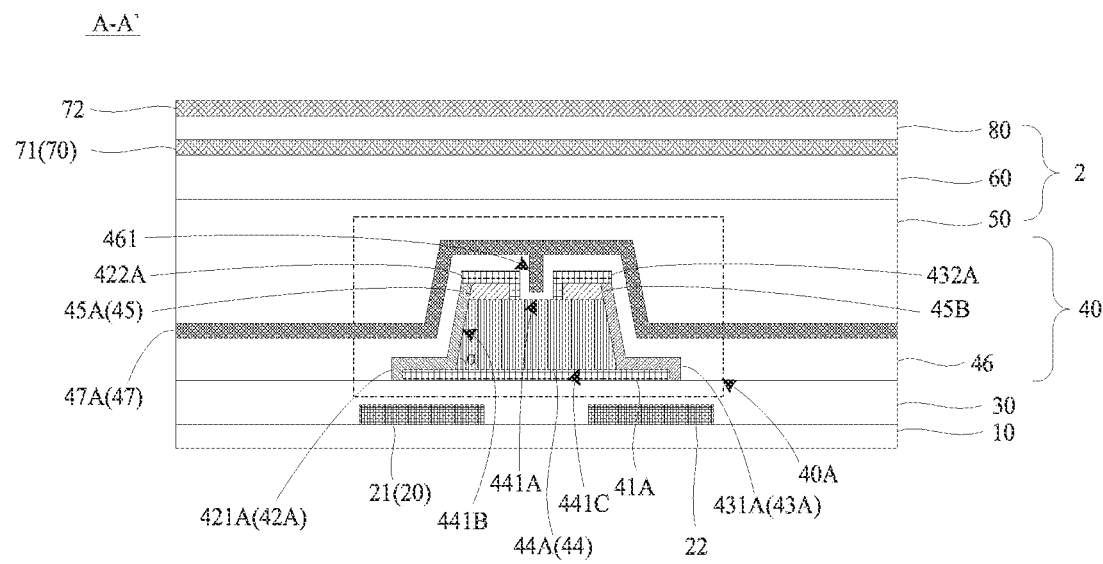
FIG. 5 is a schematic cross-sectional view along the A-A' direction in FIG. 4.
Figure 6:
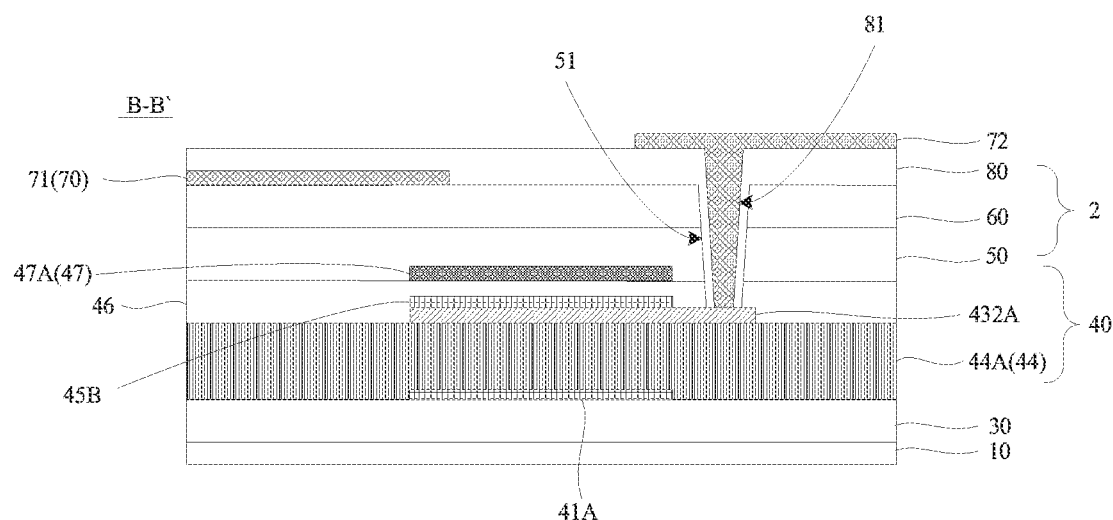
FIG. 6 is a schematic diagram of a first cross-sectional structure along the B-B' direction in FIG. 4.

In one embodiment, please refer to FIG. 4 to FIG. 6. FIG. 4 is a top cross-sectional view of a semiconductor device provided by an embodiment of the present application. FIG. 5 is a schematic cross-sectional view along the A-A' direction in FIG. 4. FIG. 6 is a schematic diagram of a first cross-sectional structure along the B-B' direction in FIG. 4.

In this embodiment, the semiconductor device 1 includes an insulating substrate 10 and a thin film transistor layer 40 disposed on the insulating substrate 10. The insulating substrate 10 may include a rigid substrate or a flexible substrate, and the material of the insulating substrate 10 is not specifically limited in this embodiment.

The thin film transistor layer 40 includes a first active layer 41A disposed on the insulating substrate 10 and a first insulating layer 44 disposed on the first active layer 41A, and a convex portion 44A is formed on the first insulating layer 44. The thin film transistor layer 40 further includes a second active layer 42A and a third active layer 43A disposed on the two sidewalls 441B and the upper surface 441A of the convex portion 44A, wherein one end of the first active layer 41A is connected to the second active layer 42A, and the other end of the first active layer 41A is connected to the third active layer 43A.

Further, the second active layer 42A includes a first conductor portion 422A positioned on the upper surface 441A of the convex portion 44A, and the third active layer 43A includes a second conductor portion 432A positioned on the upper surface 441A of the convex portion 44A, wherein the first conductor portion 422A is spaced apart from the second conductor portion 432A. Specifically, in a direction perpendicular to the insulating substrate 10, an orthographic projection of the first conductor portion 422A is positioned within an orthographic projection of the first active layer 41A, an orthographic projection of the second conductor portion 432A is positioned within an orthographic projection of the first active layer 41A, and the orthographic projection of the first conductor portion 422A does not overlap with the orthographic projection of the second conductor portion 432A. Therefore, the first conductor portion 422A and the second conductor portion 432A are prevented from contacting each other.

In this embodiment, the second active layer 42A includes a first active segment 421A positioned on the sidewall 441B and the first conductor portion 422A positioned on the upper surface 441A of the convex portion 44A. One end of the first active segment 421A is connected to the first active layer 41A, and the other end of the first active segment 421A is connected to the first conductor portion 422A. The third active layer 43A includes a second active segment 431A positioned on the sidewall 441B and the second conductor portion 432A positioned on the upper surface 441A of the convex portion 44A, wherein one end of the second active segment 431A is connected to the first active layer 41A, and the other end of the second active segment 431A is connected to the second conductor portion 432A. Furthermore, in the direction perpendicular to the insulating substrate 10, the first active segment 421A and the second active segment 431A have the same projection pattern, and the first conductor portion 422A and the second conductor portion 432A have the same projection pattern.

It should be noted that the material of the first active layer 41A, the material of the first active segment 421A, and the material of the second active segment 431A include but are not limited to amorphous silicon, polycrystalline silicon, or oxide semiconductor materials. Both the first conductor portion 422A and the second conductor portion 432A may be made of silicide polysilicon doped with n-type impurities at a high concentration. The first insulating layer 44 includes but is not limited to a liner layer. The material of the first insulating layer 44 includes but is not limited to a single-layer of silicon nitride ($Si_3N_4$), a single-layer of silicon dioxide ($SiO_2$), a single-layer of silicon oxynitride ($SiON_x$), or a double-layer structure of the above film layers. This embodiment does not specifically limit this.

In this embodiment, the thin film transistor layer 40 includes a first metal layer 45 positioned on the upper surface 441A of the convex portion 44A. The first metal layer 45 includes a source 45A connected to the first conductor portion 422A and a drain 45B connected to the second conductor portion 432A. Specifically, in this embodiment, the first metal layer 45 is stacked on the first conductor portion 422A and the second conductor portion 432A, but this embodiment does not specifically limit the positional relationship between the first metal layer 45 and the first conductor portion 422A and the second conductor portion 432A. Preferably, in this embodiment, the source 45A is positioned between the first conductor portion 422A and the convex portion 44A, and the drain 45B is positioned between the second conductor portion 432A and the convex portion 44A.

Further, the source 45A includes a first sub-portion 451A and a second sub-portion 452A, the orthographic projection of the first sub-portion 451A on the insulating substrate 10 overlaps with the orthographic projection of the first conductor portion 422A on the insulating substrate 10, and the orthographic projection of the second sub-portion 452A on the insulating substrate 10 does not overlap with the orthographic projection of the first conductor portion 422A on the insulating substrate 10. The drain 45B includes a third sub-portion 451B and a fourth sub-portion 452B. The orthographic projection of the third sub-portion 451B on the insulating substrate 10 overlaps with the orthographic projection of the second conductor portion 432A on the insulating substrate 10, and the orthographic projection of the third sub-portion 451B on the insulating substrate 10 overlaps with the orthographic projection of the second conductor portion 432A on the insulating substrate 10. That is, in this embodiment, the orthographic projection of the first conductor portion 422A on the insulating substrate 10 is positioned within the orthographic projection of the source 45A on the insulating substrate 10, and the orthographic projection of the second conductor portion 432A on the insulating substrate 10 is positioned within the orthographic projection of the drain 45B on the insulating substrate 10.

It can be understood that, in this embodiment, by setting the orthographic projection of the first sub-portion 451A on the insulating substrate 10 to overlap with the orthographic projection of the first conductor portion 422A on the insulating substrate 10, the orthographic projection of the third sub-portion 451B on the insulating substrate 10 overlaps with the orthographic projection of the second conductor portion 432A on the insulating substrate 10. Compared with the technical solution in the prior art in which the source 45A and the drain 45B are in contact with the active layer through via holes, this embodiment increases the contact areas between the source 45A and the second active layer 42A and the drain 45B and the third active layer 43A, reduces the contact resistance, and improves the stability of signal transmission.

In this embodiment, the thin film transistor layer 40 includes a second metal layer 47 positioned on the side of the first insulating layer 44 away from the insulating substrate 10. In the direction perpendicular to the insulating substrate 10, the second metal layer 47 covers the first active layer 41A, the second active layer 42A, and the third active layer 43A. Preferably, the second metal layer 47 includes a gate electrode 47A. The first active layer 41A, the first insulating layer 44, the source 45A, the drain 45B, the second active layer 42A, the third active layer 43A, and the gate electrode 47A are sequentially arranged on the on the insulating substrate 10.

Further, the thin film transistor layer 40 includes a second insulating layer 46 positioned between the second metal layer 47 and the first insulating layer 44. In a direction perpendicular to the insulating substrate 10, the second insulating layer 46 covers the first active layer 41A, the second active layer 42A, and the third active layer 43A. Wherein, on the upper surface 441A of the convex portion 44A, the second insulating layer 46 includes a groove 461 between the second active layer 42A and the third active layer 43A, and the second metal layer 47 fills the groove 461. It can be understood that, in this embodiment, on the upper surface 441A of the convex portion 44A, the second insulating layer 46 includes a groove between the second active layer 42A and the third active layer 43A 461, and the second metal layer 47 fills the groove 461. Therefore, the contact between the gate electrode 47A, the source 45A, and the drain 45B on the upper surface 441A of the convex portion 44A which may result in affecting the electrical properties of the thin film transistor layer 40 is avoided.

Further, in this embodiment, the second insulating layer 46 covers the first active layer 41A, the second active layer 42A, and the third active layer 43A. Therefore, the first active layer 41A, the second active layer 42A, and the third active layer 43A can block water and oxygen and serve as insulation. In this embodiment, the technical solution of the present application is illustrated by taking the second insulating layer 46 as the insulating layer of the gate electrode 47A as an example.

In this embodiment, the thin film transistor layer 40 includes at least one thin film transistor 40A. The thin film transistor 40A includes the first active layer 41A, the first insulating layer 44, and the second active layer 42A and the third active layer 43A disposed on the two sidewalls 441B and the upper surface 441A of the convex portion 44A. It can be understood that, in this embodiment, the second active layer 42A includes the first active segment 421A and the first conductor portion 422A, the third active layer 43A includes a second active segment 431A and the second conductor portion 432A. The first active segment 421A is connected to the first active layer 41A and the first conductor portion 422A, the second active segment 431A is connected to the first active layer 41A and the second conductor portion 432A, the first conductor portion 422A is connected to the source 45A, and the second conductor portion 432A is connected to the drain 45B, thus, the thin film transistor 40A is formed.

It should be noted that the first active layer 41A, the first insulating layer 44, the first metal layer 45, the second active layer 42A, the third active layer 43A, and the second metal layer 47 are sequentially stacked on the insulating substrate 10. That is, in this embodiment, the thin film transistor 40A is a top-gate thin film transistor 40A only for illustration, and the type of the thin film transistor 40A is not explicitly limited in this embodiment. It can be understood that in this embodiment, the first active layer 41A, the first insulating layer 44, the first metal layer 45, the second active layer 42A, the third active layer 43A, and the second metal layer 47 are arranged in a stacked structure perpendicular to the direction of the insulating substrate 10. Compared with the prior art, the area occupied by the thin film transistor 40A is reduced, and the aperture ratio is improved.

Further, in this embodiment, the thin film transistor layer 40 includes a plurality of thin film transistors 40A arranged in a matrix, and the first insulating layer 44 includes a plurality of the convex portions 44A. One of the thin film transistors 40A is disposed corresponding to one of the convex portions 44A, or the plurality of the thin film transistors 40A are disposed corresponding to one of the plurality of convex portions 44A. Preferably, in this embodiment, the technical solution of the present application is described by taking as an example that one of the thin film transistors 40A corresponds to one of the convex portions 44A.

In this embodiment, the thin film transistor layer 40 includes a channel between the first active layer 41A and the first conductor portion 422A. The relationship between the length of the channel and the height of the convex portion 44A meets the following formula:

$$L \equiv \frac{H}{\operatorname{Sin}(\alpha)}; \qquad (1)$$

wherein L represents the length of the channel, H represents the height of the convex portion 44A, and a represents an angle between the sidewall 441B and a lower surface 441C of the convex portion 44A.

Further, a cross-section of the sidewall 441B of the convex portion 44A in the direction perpendicular to the insulating substrate 10 includes a straight line or an arc. Preferably, in this embodiment, the cross-section of the sidewall 441B of the convex portion 44A in the direction perpendicular to the insulating substrate 10 includes a straight line, and the cross-sectional shape of the convex portion 44A is a trapezoid. The convex portion 44A includes an upper surface 441A connecting the two sidewalls 441B and away from the insulating substrate 10, and a lower surface 441C connecting the two sidewalls 441B and close to the insulating substrate 10. The angle α between the sidewall 441B and the lower surface 441C of the convex portion 44A is greater than or equal to 45 degrees and less than 90 degrees.

Specifically, in this embodiment, the direction in which the first conductor portion 422A points to the second conductor portion 432A is the first direction X, the extension direction of the convex portion 44A is the second direction Y, wherein first direction X and the second direction Y form a predetermined angle, and the plane defined by the first direction X and the second direction Y is parallel to the substrate. Wherein, in the second direction Y, the thickness of the convex portion 44A ranges from 100 angstroms to 10000 angstroms, the length of the channel is greater than or equal to 100 angstroms and less than or equal to 10000 angstroms, and the width of the channel is greater than or equal to 300 angstroms and less than or equal to 100000 angstroms.

It should be noted that, in this embodiment, the range of the preset angle and the directions of the first direction X and the second direction Y are not limited herein. However, for the convenience of description, in this embodiment, the preset angle is 90°, the first direction is the direction X, and the second direction is the direction Y as an example for illustration.

It can be understood that, in this embodiment, the channel between the source 45A and the drain 45B is formed by the first active segment 421A and the second active segment 431A positioned on the two sidewalls 441B of the convex portion 44A. That is, the length of the channel is determined by the lengths of the two sidewalls 441B of the convex portions 44A and the angles α between the sidewalls 441B and the lower surface 441C of the convex portion 44A. The width of the channel is determined by the sum of the orthographic width of the first active segment 421A on the convex portion 44A and the orthographic width of the second active segment 431A on the convex portion 44A. Thus, despite the limited process capability of the exposure equipment, the lengths of the two sidewalls 441B of the convex portion 44A and the angles α between the sidewalls 441B and the lower surface 441C of the convex portion 44A can be controlled. Therefore, the length of the channel can be controlled independently of the exposure equipment, that is, shortening of the channel of the thin film transistor 40A is realized.

In this embodiment, the second active layer 42A includes a first conductor portion 422A positioned on the upper surface 441A of the convex portion 44A. The third active layer 43A includes a second conductor portion 432A positioned on the upper surface 441A of the convex portion 44A, wherein the first conductor portion 422A is spaced apart from the second conductor portion 432A. Specifically, in the direction perpendicular to the insulating substrate 10, the orthographic projection of the first conductor portion 422A is positioned within the orthographic projection of the first active layer 41A, the orthographic projection of the second conductor portion 432A is positioned within the orthographic projection of the first active layer 41A, and the orthographic projection of the first conductor portion 422A and the orthographic projection of the second conductor portion 432A do not overlap each other, thereby reducing the channel length. In addition, under the condition that the width of the channel is constant, shortening the length of the channel can make the thin film transistor 40A have a larger aspect ratio. Therefore, the on-state current is larger, and the power consumption of the thin film transistor 40A is reduced.

It should be noted that the cross-sectional shape of the convex portion 44A is a trapezoid only for illustration. For example: in another embodiment, the cross-section of the sidewall 441B of the convex portion 44A in the direction perpendicular to the insulating substrate 10 is an arc. The cross-sectional shape of the convex portion 44A is at least one of circle or ellipse.

In this embodiment, the semiconductor device 1 includes an electrode layer 70 positioned on the side of the thin film transistor layer 40 away from the insulating substrate 10. The electrode layer 70 is connected to the second sub-portion 452A, or the electrode layer 70 is connected to the fourth sub-portion 452B. Preferably, in this embodiment, the electrode layer 70 is connected to the fourth sub-portion 452B.

Further, in this embodiment, the semiconductor device 1 further includes a third insulating layer 2 on the side of the thin film transistor layer 40 away from the insulating substrate 10, and the electrode layer 70 is positioned on the side of the third insulating layer 2 away from the thin film transistor layer 40. Specifically, the third insulating layer 2 includes an interlayer insulating layer 50 positioned on the side of the thin film transistor layer 40 away from the insulating substrate 10, a planarization layer 60 on the side of the interlayer insulating layer 50 away from the thin film transistor layer 40, and a passivation layer 80 on the side of the planarization layer 60 away from the interlayer insulating layer 50. The electrode layer 70 includes a first electrode 71 and a second electrode 72, wherein the first electrode 71 is positioned between the planarization layer 60 and the passivation layer 80, and the second electrode 72 is positioned on the side of the passivation layer 80 away from the planarization layer 60. Preferably, the first electrode 71 is a common electrode, and the second electrode 72 is a pixel electrode.

The semiconductor device 1 is defined with a first via hole 51 penetrating through the second insulating layer 46 and the third insulating layer 2, and the first via hole 51 is positioned above the drain 45B. Specifically, the first via hole 51 penetrates through the second insulating layer 46, the interlayer insulating layer 50, and the planarization layer 60. The passivation layer 80 is defined with a second via hole 81 exposing a portion of the drain 45B, and the second electrode 72 is connected to the drain 45B through the first via hole 51 and the second via hole 81. In the direction perpendicular to the insulating substrate 10, the diameter of the second via hole 81 is less than that of the first via hole 51. In the first via hole 51, the passivation layer 80 covers the inner wall of the planarization layer 60. In this way, the planarization layer 60 can block water and oxygen and serve as insulation.

It can be understood that in this embodiment, the orthographic projection of the fourth sub-portion 452B on the insulating substrate 10 and the orthographic projection of the second conductor portion 432A on the insulating substrate 10 do not overlap with each other. That is, in this embodiment, along the A-A' direction, the length of the second conductor portion 432A is greater than the length of the second semiconductor portion, wherein, the first via hole 51 and the second via hole 81 are positioned on the fourth sub-portion 452B. Thus, the connection between the drain 45B and the electrode layer 70 is facilitated.

It should be noted that, in this embodiment, the third insulating layer 2 includes the interlayer insulating layer 50, the planarization layer 60, and the passivation layer 80 only for illustration. This embodiment does not specifically limit the film layer structure of the third insulating layer 2.

In this embodiment, the thin film transistor layer 40 further includes a control circuit (not shown), and the control circuit includes a plurality of the thin film transistors 40A, wherein the control circuit includes but is not limited to IC circuits such as pixel circuits, driving circuits, multiplexing circuits, and logic circuits, etc. It can be understood that, in the embodiment of the present application, the thin film transistor layer 40 includes the second active layer 42A and the third active layer 43A disposed on the two sidewalls 441B and the upper surface 441A of the convex portion 44A, wherein one end of the first active layer 41A is connected to the second active layer 42A, and the other end of the first active layer 41A is connected to the third active layer 43A. Therefore, the channel length is reduced, the short channel effect is reduced, the on-state current is increased, the power consumption is reduced, and the integration degree of the thin film transistor 40A is improved.

In this embodiment, the semiconductor device 1 further includes a light shielding layer 20 and a buffer layer 30 stacked on the insulating substrate 10. The orthographic projection of the light shielding layer 20 on the insulating substrate 10 covers the orthographic projection of the first active segment 421A on the substrate, and the orthographic projection of the light shielding layer 20 on the insulating substrate 10 covers the orthographic projection of the second active segment 431A on the substrate. It can be understood that the light shielding layer 20 can shield the light emitted to the first active layer 41A and the second active layer 42A. Thus, the increase in leakage current caused by photogenerated carriers generated by irradiating the first active layer 41A and the second active layer 42A with light is reduced. In addition, the stability of the semiconductor device 1 during operation is maintained. Further, the light shielding layer 20 includes a first shielding sub-layer 21 and a second shielding sub-layer 22 arranged at intervals, and the first shielding sub-layer 21 is arranged corresponding to the first active segment 421A. The orthographic projection of the first shielding sub-layer 21 on the insulating substrate 10 covers the orthographic projection of the first active segment 421A on the insulating substrate 10, and the second shielding sub-layer 22 is arranged corresponding to the second active segment 431A. The orthographic projection of the second shielding sub-layer 22 on the insulating substrate 10 covers the orthographic projection of the second active segment 431A on the insulating substrate 10.

Figure 7:
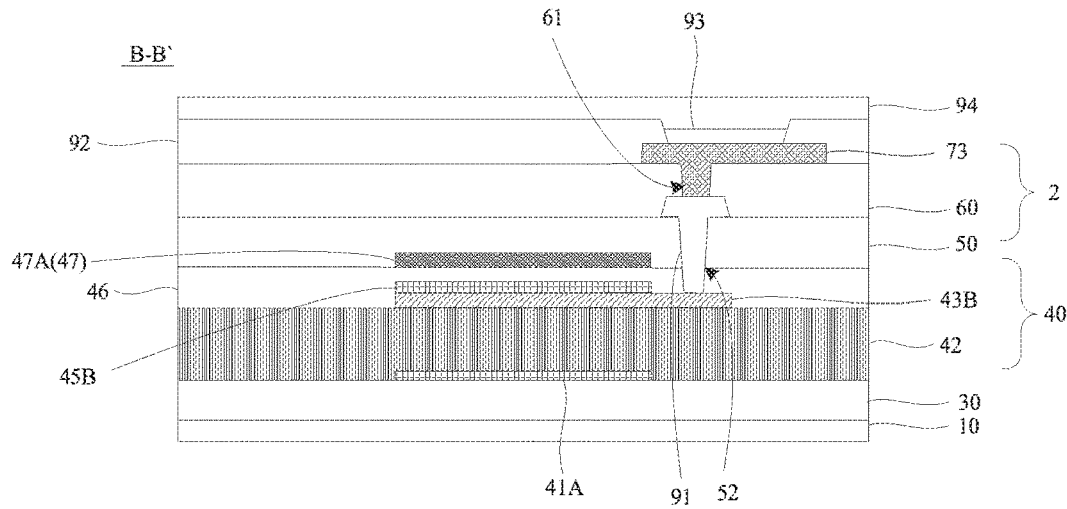
FIG. 7 is a schematic diagram of a second cross-sectional structure along the B-B' direction in FIG. 4.

In another embodiment, please refer to FIG. 4, FIG. 5, and FIG. 7. FIG. 7 is a schematic diagram of a second cross-sectional structure along the B-B' direction in FIG. 4.

In this embodiment, the structure of the semiconductor device is similar/same as the structure of the semiconductor device provided in the above-mentioned embodiment. For details, please refer to the description of the semiconductor device in the above embodiment, which will not be repeated herein. The difference between the two is:

In this embodiment, the semiconductor device 1 further includes a bridge layer 91 between the planarization layer 60 and the passivation layer 80, a light-emitting device layer (not marked in the figure) on the side of the passivation layer 80 away from the planarization layer 60, and an encapsulation layer (not shown) on the side of the light-emitting device layer away from the passivation layer 80. The light-emitting device layer includes an anode 73, a light-emitting layer 93, and a cathode 94 stacked on the passivation layer 80, wherein the electrode layer 70 includes the anode 73.

Further, the third insulating layer 2 includes an interlayer insulating layer 50 positioned on the side of the thin film transistor 40A4 away from the insulating substrate 10, a planarization layer 60 on the side of the interlayer insulating layer 50 away from the thin film transistor layer 40, and a pixel definition layer 92 on the side of the planarization layer 60 away from the interlayer insulating layer 50. A first opening (not marked in the figure) is defined on the pixel definition layer 92 to expose the anode 73, and the light-emitting layer 93 is in the opening. The light-emitting layer 93 is connected to the anode 73 through the opening, and the cathode 94 is connected to the light-emitting layer 93 through the opening.

The semiconductor device 1 is defined with a third via hole 52 penetrating through the second insulating layer 46 and the interlayer insulating layer 50, and the bridge layer 91 is connected to the drain 45B through the third via hole 52. The planarization layer 60 is defined with a second opening (not marked in the figure) exposing part of the bridge layer 91, the anode 73 is connected to the bridging layer 91 through the second opening, and the anode 73 is connected to the drain 45B through the bridge layer 91.

It can be understood that, in this embodiment, the passivation layer 80, the bridge layer 91, the planarization layer 60, the anode 73, the light-emitting layer 93, the cathode 94, and the encapsulation layer is a conventional film layer, which will not be described in detail in this embodiment.

Figure 8:
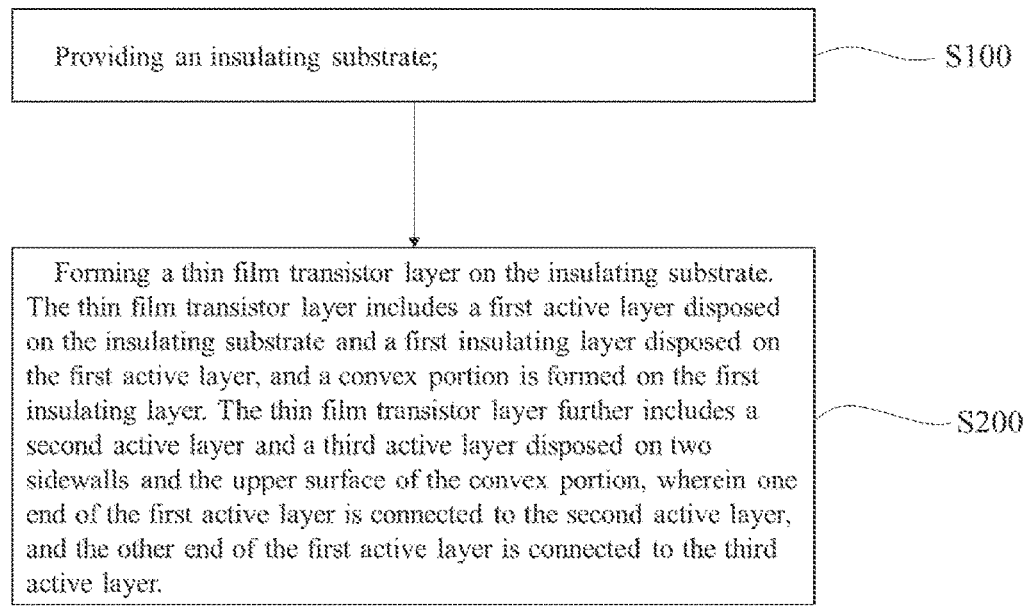
FIG. 8 is a flowchart of a method of manufacturing the semiconductor device provided by an embodiment of the present application.

The embodiment of the present application also provides a method for manufacturing the semiconductor device 1. Please refer to FIG. 4, FIG. 8, and FIG. 9A to FIG. 9H. Wherein, FIG. 8 is a flowchart of a method of manufacturing a semiconductor device 1 provided by an embodiment of the present application, and FIG. 9A to FIG. 9L are structural process flow diagrams for manufacturing the semiconductor device in FIG. 8.

Figure 9A:
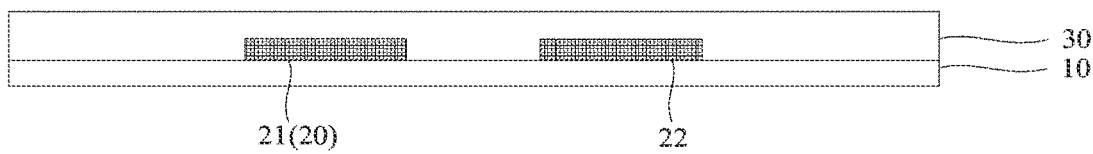
FIGS. 9A, 9B, 9C, 9D, 9E, 9F, 9G, 9H, 9I, 9J, 9K and FIG. 9L are process flow diagrams of manufacturing the semiconductor device in FIG. 8.

In this embodiment, the manufacturing method of the semiconductor device 1 includes following steps:

Step S100: providing an insulating substrate 10, and a light shielding layer 20 and a buffer layer 30 sequentially formed on the insulating substrate 10, as shown in FIG. 9A.

Wherein, when the insulating substrate 10 is a rigid substrate, the material can be metal or glass. When the insulating substrate 10 is a flexible substrate, materials may include at least one of an acrylic resin, a methacrylic resin, polyisoprene, a vinyl resin, an epoxy-based resin, a polyurethane-based resin, a cellulose resin, a silicone resin, a polyimide-based resin, or a polyamide-based resin.

The material of the light shielding layer 20 includes but is not limited to metal materials. The metal material includes but is not limited to one of molybdenum (Mo), titanium (Ti), nickel (Ni), or an alloy thereof. The material of the buffer layer 30 includes but is not limited to a single-layer of silicon nitride ($Si_3N_4$), a single-layer of silicon dioxide ($SiO_2$), a single-layer of silicon oxynitride ($SiON_x$), or a double-layer structure composed of the above film layers.

Step S200: forming a thin film transistor layer 40 on the insulating substrate 10. The thin film transistor layer 40 includes a first active layer 41A disposed on the insulating substrate 10 and a first insulating layer 44 disposed on the first active layer 41A, and a convex portion 44A is formed on the first insulating layer 44. The thin film transistor layer 40 further includes a second active layer 42A and a third active layer 43A disposed on two sidewalls 441B and the upper surface 441A of the convex portion 44A, wherein one end of the first active layer 41A is connected to the second active layer 42A, and the other end of the first active layer 41A is connected to the third active layer 43A.

Figure 9B:
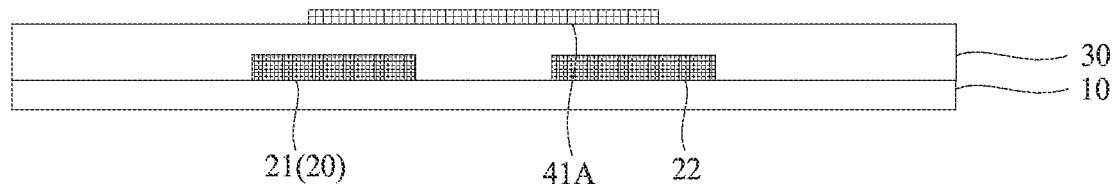

Specifically, in this embodiment, the step S200 includes the following steps: Step S201: forming a first active layer 41A on the insulating substrate 10, as shown in FIG. 9B.

Figure 9C:
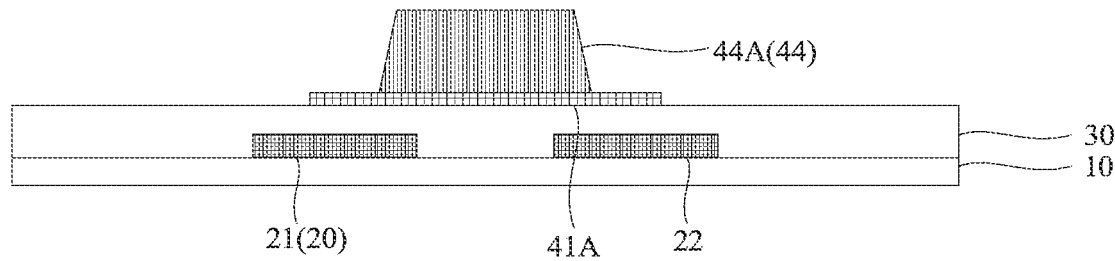

Step S202: forming a first insulating layer 44 on the first active layer 41A. The first insulating layer 44 includes a convex portion 44A positioned on the first active layer 41A, as shown in FIG. 9C. The material of the first insulating layer 44 includes but is not limited to a single-layer of silicon nitride ($Si_3N_4$), a single-layer of silicon dioxide ($SiO_2$), a single-layer of silicon oxynitride ($SiON_x$), or a double layer of the above film layers. The orthographic projection of the convex portion 44A on the insulating substrate 10 is positioned within the orthographic projection of the first active layer 41A on the insulating substrate 10.

Step S203: forming a first metal layer 45 on the upper surface 441A of the convex portion 44A. The material of the first metal layer 45 includes, but is not limited to at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W).

Figure 9D:
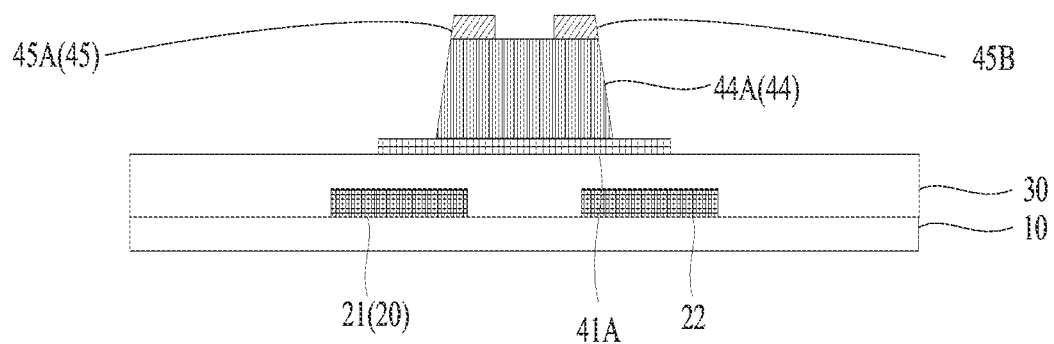

Step S204: patterning the first metal layer 45. A source 45A and a drain 45B spaced apart from each other are formed on the upper surface 441A of the convex portion 44A, as shown in FIG. 9D.

Figure 9E:
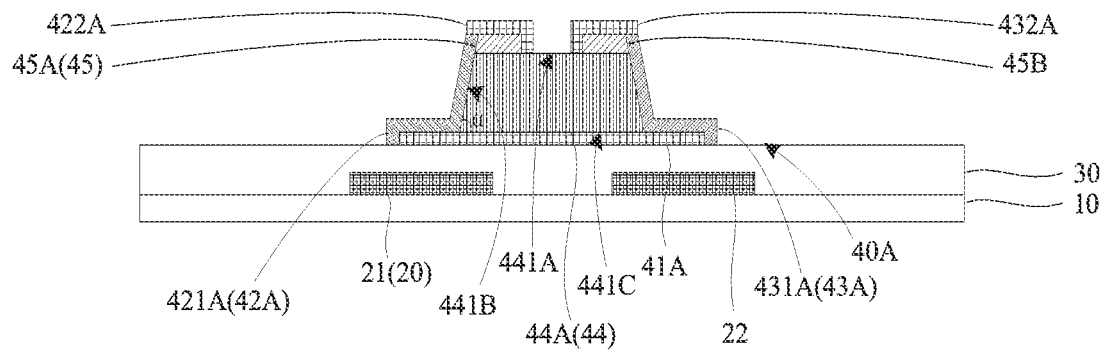

Step S205: forming a second active layer 42A on the source 45A, and forming a third active layer 43A on the drain 45B. The second active layer 42A includes a first active segment 421A positioned on the sidewall 441B of the convex portion 44A and a first conductor portion 422A positioned on the upper surface 441A of the convex portion 44A, wherein one end of the first active segment 421A is connected to the first source 45A, and the other end of the first active segment 421A is connected to the first conductor portion 422A. The third active layer 43A includes a second active segment 431A positioned on the sidewall 441B of the convex portion 44A and a second conductor portion 432A positioned on the upper surface 441A of the convex portion 44A, wherein one end of the second active segment 431A is connected to the first source 45A, and the other end of the second active segment 431A is connected to the second conductor portion 432A. The first conductor portion 422A is arranged spaced apart from the second conductor portion 432A, as shown in FIG. 9E.

It should be noted that, in this embodiment, the material of the first active layer 41A, the material of the first active segment 421A, and the material of the second active segment 431A include but are not limited to amorphous silicon, polycrystalline silicon, or oxide semiconductor materials. Both the first conductor portion 422A and the second conductor portion 432A may be made of silicide polysilicon doped with n-type impurities at a high concentration, which is not specifically limited in this embodiment.

In this embodiment, the manufacturing method of the semiconductor device 1 further includes following steps:

Step S300: forming a second insulating layer 46 on the second active layer 42A and the third active layer 43A. In the direction perpendicular to the insulating substrate 10, the second insulating layer 46 covers the first active layer 41A, the second active layer 42A, and the third active layer 43A, wherein on the upper surface 441A of the convex portion 44A, the second insulating layer 46 includes a groove 461 positioned between the second active layer 42A and the third active layer 43A.

Figure 9F:
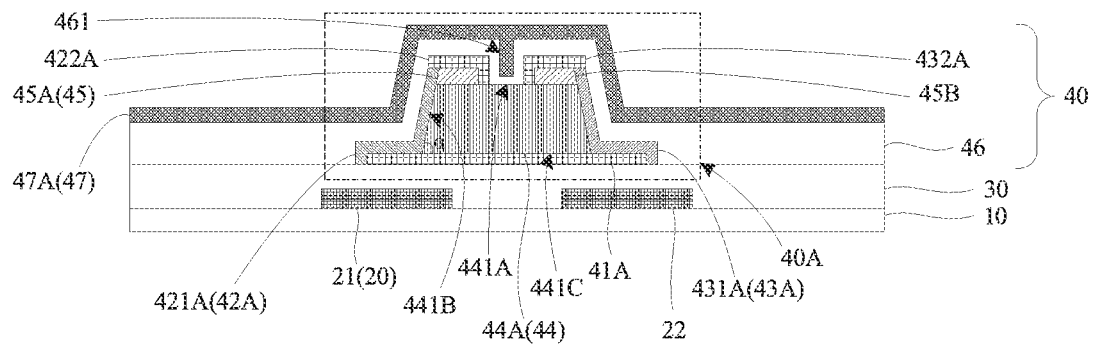

Step S400: forming a second metal layer 47 on the second insulating layer 46 in a direction away from the insulating substrate 10. In a direction perpendicular to the insulating substrate 10, the second metal layer 47 covers the first active layer 41A, the second active layer 42A, and the third active layer 43A, and the second metal layer 47 fills the groove 461, as shown in FIG. 9F. Preferably, the second metal layer 47 includes but is not limited to the gate electrode 47A.

It can be understood that, in this embodiment, the channel of the thin film transistor layer 40 is positioned between the first active layer 41A and the first conductor portion 422A, and between the first active layer 41A and the second conductor portion 432A. That is, the channel between the source 45A and the drain 45B is formed by the first active segment 421A and the second active segment 431A positioned on the two sidewalls 441B of the convex portion 44A. The length of the channel is determined by the lengths of the two sidewalls 441B of the convex portions 44A and the angles α between the sidewalls 441B and the lower surface 441C of the convex portion 44A. The width of the channel is determined by the sum of the orthographic width of the first active segment 421A on the convex portion 44A and the orthographic width of the second active segment 431A on the convex portion 44A. Thus, despite the limited process capability of the exposure equipment, the lengths of the two sidewalls 441B of the convex portion 44A and the angles α between the sidewalls 441B and the lower surface 441C of the convex portion 44A can be controlled. Therefore, the length of the channel can be controlled independently of the exposure equipment, that is, shortening of the channel of the thin film transistor 40A is realized.

It should be noted that, in this embodiment, the light shielding layer 20 includes a first shielding sub-layer 21 and a second shielding sub-layer 22 arranged at intervals, and the first shielding sub-layer 21 is arranged corresponding to the first active segment 421A. The orthographic projection of the first shielding sub-layer 21 on the insulating substrate 10 covers the orthographic projection of the first active segment 421A on the insulating substrate 10, and the second shielding sub-layer 22 is arranged corresponding to the second active segment 431A. The orthographic projection of the second shielding sub-layer 22 on the insulating substrate 10 covers the orthographic projection of the second active segment 431A on the insulating substrate 10. Thus, the increase in leakage current caused by photogenerated carriers generated by irradiating the first active layer 41A and the second active layer 42A with light is reduced. In addition, the stability of the semiconductor device 1 during operation is maintained.

Figure 9G:
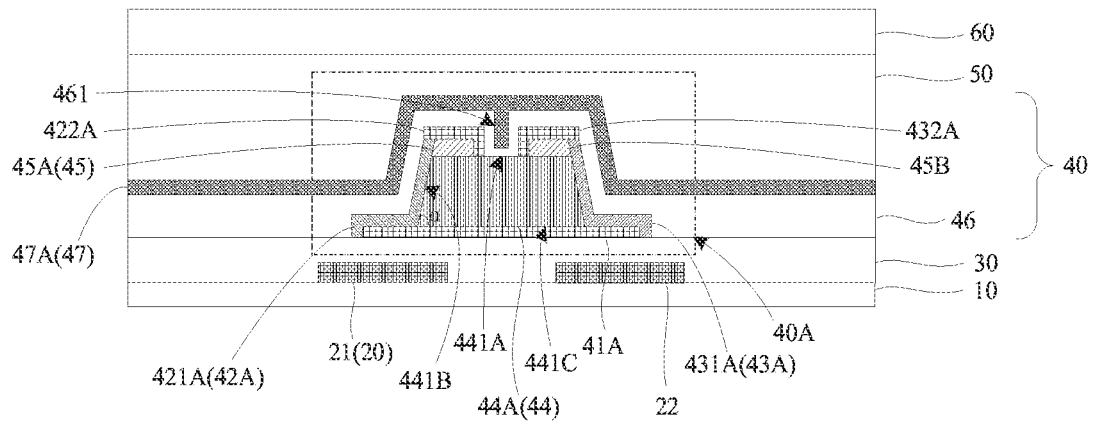

Step S500: forming an interlayer insulating layer 50 and a planarizing layer 60 in sequence on the side of the gate electrode 47A away from the second insulating layer 46, as shown in FIG. 9G.

Figure 9H:
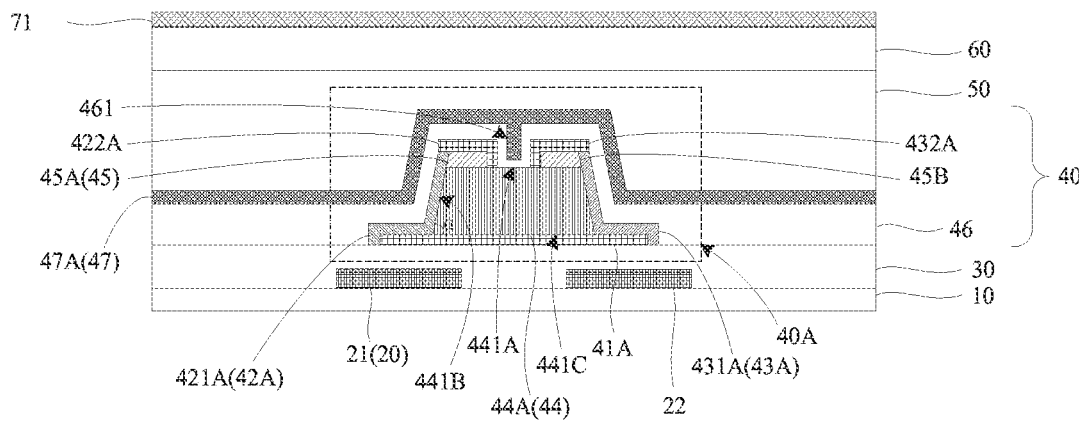

Step S600: forming a first electrode 71 on the side of the planarization layer 60 away from the interlayer insulating layer 50, as shown in FIG. 9H.

Figure 9I:
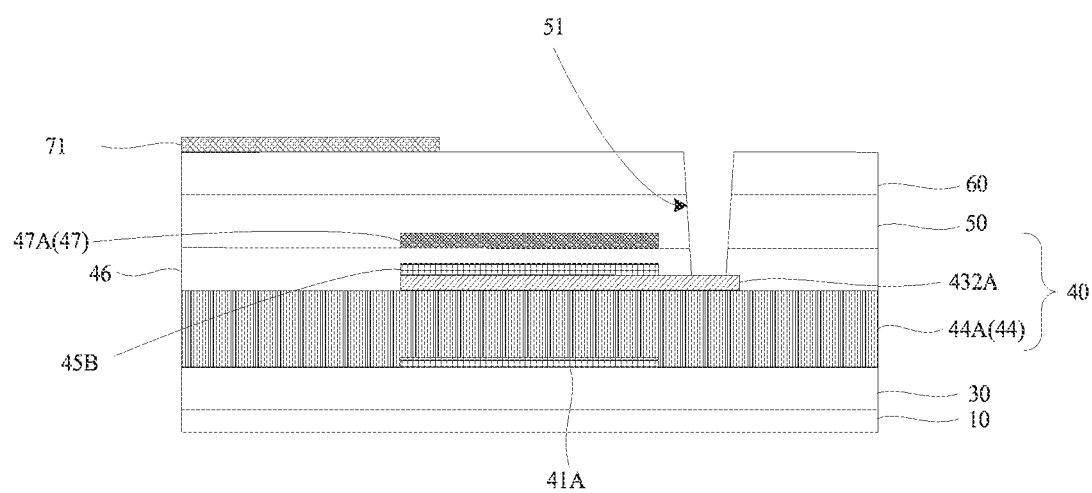

Step S700: defining a first via hole 51 on the planarization layer 60, the interlayer insulating layer 50, and the second insulating layer 46 through a photomask to expose part of the drain 45B, as shown in FIG. 9I.

Figure 9J:
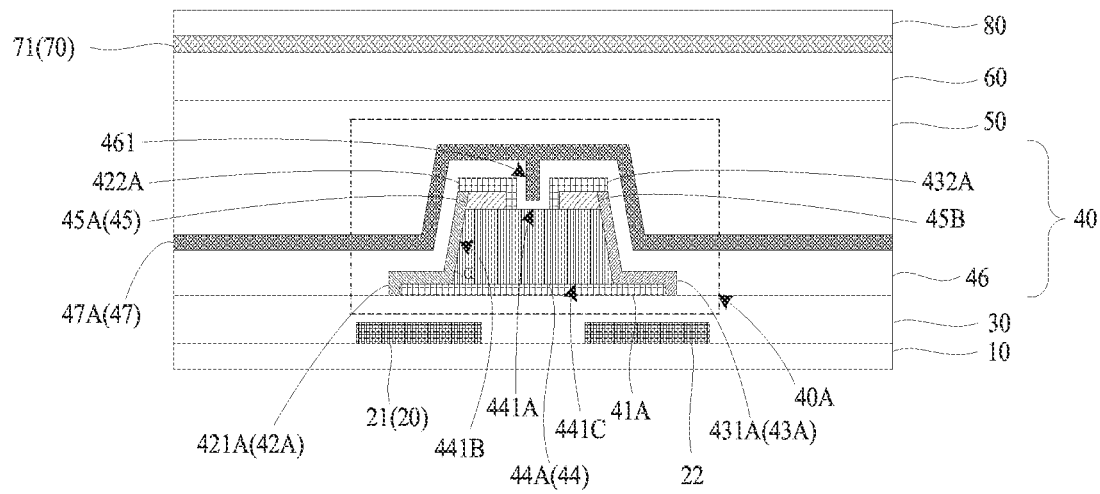
Figure 9K:
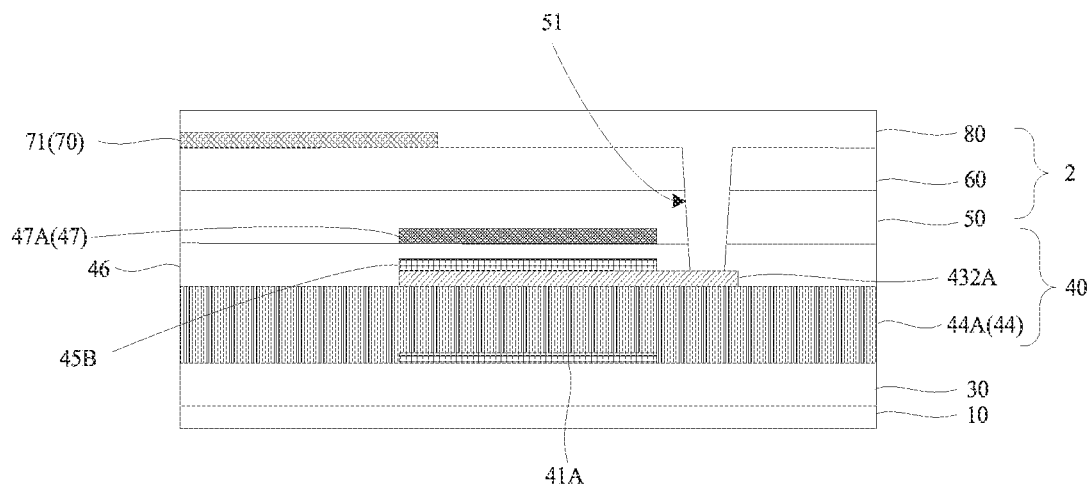

Step S800: forming a passivation layer 80 on the side of the first electrode 71 away from the planarization layer 60, as shown in FIG. 9J. Further, the passivation layer 80 fills the first via hole 51, the passivation layer 80 covers the upper surface 441A of the planarization layer 60 and the inner wall of the first via hole 51. Therefore, the planarization layer 60 can block water and oxygen and act as insulation, as shown in FIG. 9K.

Figure 9L:
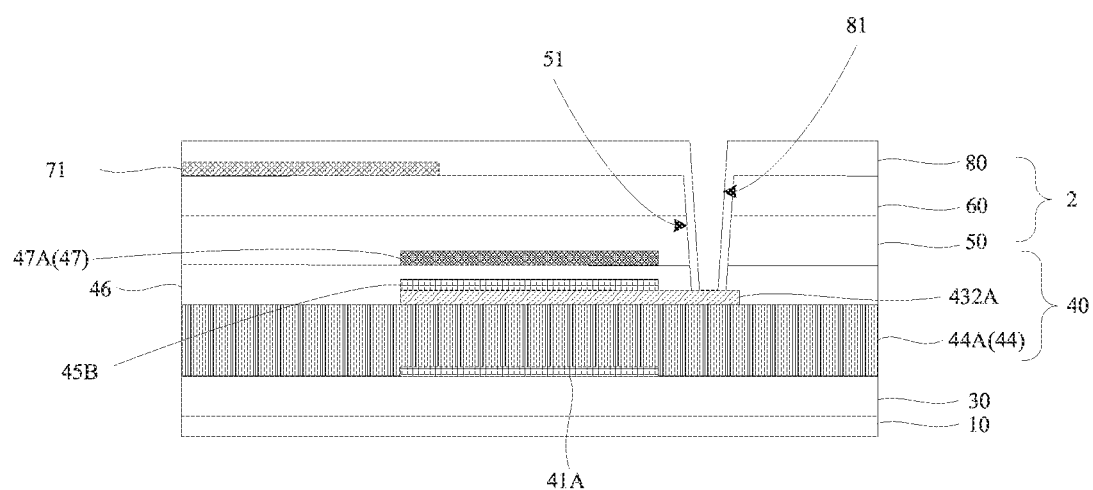

Step S900: defining a second via hole 81 on the passivation layer 80 through a photomask to expose part of the drain 45B, and the diameter of the second via hole 81 is less than that of the first via hole 51, as shown in FIG. 9L.

Step S1000: forming a second electrode 72 on the side of the passivation layer 80 away from the first electrode 71, as shown in FIG. 5. Further, the second electrode 72 is connected to the drain 45B through the second via hole 81, as shown in FIG. 6.

The first electrode 71 and the second electrode 72 both include metal oxide materials. The metal oxide material includes but is not limited to indium gallium zinc oxide (IGZO). Preferably, the first electrode 71 is a common electrode, and the second electrode 72 is a pixel electrode.

It should be noted that, referring to FIG. 4, in this embodiment, FIG. 9A to FIG. 9J are schematic cross-sectional views along the first direction X in FIG. 4, and FIG. 9I to FIG. 9L are schematic cross-sectional views along the second direction Y in FIG. 4.

This embodiment provides an electronic device, and the electronic device includes the semiconductor device described in any of the foregoing embodiments.

It can be understood that the semiconductor device has been described in detail in the above embodiments, and the description will not be repeated herein.

In specific applications, the electronic device can be a display screen of a smart phone, a tablet computer, a notebook computer, a smart bracelet, a smart watch, smart glasses, a smart helmet, a desktop computer, a smart TV, or a digital camera, etc. It can even be applied to electronic devices with flexible displays.

In conclusion, although the present application has disclosed the above-mentioned preferred embodiments, the embodiments are not intended to limit the present invention. One ordinary skill in the art can make various changes and modifications without departing from the spirit and scope of the present invention. Therefore, the protection scope of the present application is subject to the scope defined by the claims.

What is claimed is:

1. A semiconductor device, comprising:
    an insulating substrate; and
    a thin film transistor layer disposed on the insulating substrate, wherein the thin film transistor layer comprises a first active layer disposed on the insulating substrate and a first insulating layer disposed on the first active layer, and a convex portion is formed on the first insulating layer; and
    wherein the thin film transistor layer further comprises a second active layer and a third active layer disposed on two sidewalls and an upper surface of the convex portion, one end of the first active layer is connected to the second active layer, and another end of the first active layer is connected to the third active layer;
    wherein the thin film transistor layer comprises a first metal layer positioned on a side of the first insulating layer away from the insulating substrate, and wherein in a direction perpendicular to the insulating substrate, the first metal layer covers the first active layer, the second active layer, and the third active layer;
    wherein the thin film transistor layer comprises a second insulating layer positioned between the first metal layer and the first insulating layer, wherein in a direction perpendicular to the insulating substrate, the second insulating layer covers the first active layer, the second active layer, and the third active layer; and wherein on the upper surface of the convex portion, the second insulating layer is defined with a groove positioned between the second active layer and the third active layer, and the first metal layer fills the groove.

2. The semiconductor device of claim 1, wherein the second active layer comprises a first conductor portion positioned on the upper surface of the convex portion, the third active layer comprises a second conductor portion positioned on the upper surface of the convex portion, and the first conductor portion is spaced apart from the second conductor portion.

3. The semiconductor device of claim 2, wherein in a direction perpendicular to the insulating substrate, an orthographic projection of the first conductor portion is positioned within an orthographic projection of the first active layer, an orthographic projection of the second conductor portion is positioned within an orthographic projection of the first active layer, and the orthographic projection of the first conductor portion does not overlap with the orthographic projection of the second conductor portion.

4. The semiconductor device of claim 2, wherein the thin film transistor layer comprises a second metal layer positioned on the upper surface of the convex portion, and the second layer comprises a source connected to the first conductor portion and a drain connected to the second conductor portion.

5. The semiconductor device of claim 4, wherein the source comprises a first sub-portion and a second sub-portion, an orthographic projection of the first sub-portion on the insulating substrate overlaps with an orthographic projection of the first conductor portion on the insulating substrate, and an orthographic projection of the second sub-portion on the insulating substrate does not overlap with the orthographic projection of the first conductor portion on the insulating substrate; and wherein the drain comprises a third sub-portion and a fourth sub-portion, an orthographic projection of the third sub-portion on the insulating substrate overlaps with an orthographic projection of the second conductor portion on the insulating substrate, and an orthographic projection of the fourth sub-portion on the insulating substrate does not overlap with the orthographic projection of the second conductor portion on the insulating substrate.

6. The semiconductor device of claim 5, wherein the semiconductor device comprises an electrode layer positioned on a side of the thin film transistor layer away from the insulating substrate, and the electrode layer is connected to the second sub-portion or the fourth sub-portion.

7. The semiconductor device of claim 4, wherein the source is positioned between the first conductor portion and the convex portion, and the drain is positioned between the second conductor portion and the convex portion.

8. The semiconductor device of claim 2, wherein the thin film transistor layer comprises a channel positioned between the first active layer and the first conductor portion, and a relationship between a length of the channel and a height of the convex portion meets following formula:

$$L \equiv \frac{H}{\sin(\alpha)}; \quad (1)$$

wherein L represents the length of the channel, H represents the height of the convex portion, and a represents an angle between one of the sidewalls and a lower surface of the convex portion.

9. The semiconductor device of claim 8, wherein the angle α between the sidewall and the lower surface of the convex portion is greater than or equal to 45 degrees and less than 90 degrees.

10. The semiconductor device of claim 8, wherein in a direction perpendicular to the insulating substrate, the length of the channel is greater than or equal to 100 angstroms and less than or equal to 10000 angstroms, and a width of the channel is greater than or equal to 300 angstroms and less than or equal to 100000 angstroms.

11. The semiconductor device of claim 1, wherein the thin film transistor layer comprises a plurality of thin film transistors, the first insulating layer comprises a plurality of convex portions, and one of the plurality of thin film transistors is arranged corresponding to one of the plurality of convex portions, or the plurality of the thin film transistors are arranged corresponding to one of the plurality of convex portions.

12. The semiconductor device of claim 1, wherein a cross-section of one of the sidewalls of the convex portion in a direction perpendicular to the insulating substrate comprises a straight line or an arc.

13. The semiconductor device of claim 1, further comprising a light shielding layer positioned between the insulating substrate and the first active layer, wherein the second active layer comprises a first active segment positioned on one of the sidewalls, the third active layer comprises a second active segment positioned on another one of the sidewalls, and wherein an orthographic projection of the light shielding layer on the insulating substrate covers an orthographic projection of the first active segment on the insulating substrate, and the orthographic projection of the light shielding layer on the insulating substrate covers an orthographic projection of the second active segment on the substrate.

14. An electronic device comprising a semiconductor device, the semiconductor device comprising:

an insulating substrate; and a thin film transistor layer disposed on the insulating substrate, wherein the thin film transistor layer comprises a first active layer disposed on the insulating substrate and a first insulating layer disposed on the first active layer, and a convex portion is formed on the first insulating layer; and wherein the thin film transistor layer further comprises a second active layer and a third active layer disposed on two sidewalls and an upper surface of the convex portion, one end of the first active layer is connected to the second active layer, and another end of the first active layer is connected to the third active layer;

wherein the thin film transistor layer comprises a first metal layer positioned on a side of the first insulating layer away from the insulating substrate, and wherein in a direction perpendicular to the insulating substrate, the first metal layer covers the first active layer, the second active layer, and the third active layer;

wherein the thin film transistor layer comprises a second insulating layer positioned between the first metal layer and the first insulating layer, wherein in a direction perpendicular to the insulating substrate, the second insulating layer covers the first active layer, the second active layer, and the third active layer; and wherein on the upper surface of the convex portion, the second insulating layer is defined with a groove positioned between the second active layer and the third active layer, and the first metal layer fills the groove.

15. The electronic device of claim 14, wherein the second active layer comprises a first conductor portion positioned on the upper surface of the convex portion, the third active layer comprises a second conductor portion positioned on the upper surface of the convex portion, and the first conductor portion is spaced apart from the second conductor portion.

16. The electronic device of claim 14, wherein the thin film transistor layer comprises a plurality of thin film transistors, the first insulating layer comprises a plurality of convex portions, and one of the plurality of thin film transistors is arranged corresponding to one of the plurality of convex portions, or the plurality of the thin film transistors are arranged corresponding to one of the plurality of convex portions.

17. The electronic device of claim 14, wherein a cross-section of one of the sidewalls of the convex portion in a direction perpendicular to the insulating substrate comprises a straight line or an arc.

\* \* \* \* \*